United States Patent [19]

Smollin

[11] 4,399,558
[45] Aug. 16, 1983

[54] CASCADED DIGITAL BROADCAST TRANSMITTER

[75] Inventor: Charles F. Smollin, Hamilton Township, Mercer County, N.J.

[73] Assignee: RCA Corporation, New York, N.Y.

[21] Appl. No.: 278,454

[22] Filed: Jun. 29, 1981

[51] Int. Cl.³ .............................................. H03C 1/04
[52] U.S. Cl. .................................. 455/108; 455/116; 332/9 R
[58] Field of Search ............................. 375/24, 59, 22; 455/103, 105, 108, 116; 332/9 R, 11 R, 31 R, 40, 41, 31 T; 340/347 DD; 328/14; 330/150, 154, 207 A, 251

[56] References Cited

U.S. PATENT DOCUMENTS

| | | | |
|---|---|---|---|
| 3,480,881 | 11/1969 | Boykin | 332/9 R |
| 3,579,081 | 5/1971 | Bates | 328/14 |
| 4,164,714 | 8/1979 | Swanson | 332/31 R |
| 4,274,055 | 6/1981 | Assard | 328/14 |

*Primary Examiner*—Benedict V. Safourek
*Assistant Examiner*—Stephen Chin
*Attorney, Agent, or Firm*—E. M. Whitacre; W. H. Meise; H. I. Steckler

[57] ABSTRACT

A digital AM broadcast transmitter features a plurality of stages that are controlled by a digital signal representing an audio modulating signal. At least some of the stages are cascade coupled together using transformers. This reduces the need for high turns ratios and allows most or all transformers to be identical.

6 Claims, 5 Drawing Figures

CASCADED DIGITAL BROADCAST TRANSMITTER

BACKGROUND OF THE INVENTION

The present invention relates to broadcast transmitters, and more particularly, to such transmitters that use digital techniques to achieve amplitude modulation.

The use of digital techniques to synthesize an AM (amplitude modulated) RF (radio frequency) waveform is known from U.S. patent application Ser. No. 217,795, filed Dec. 18, 1980 in the names of B. J. Lechner and F. J. Marlowe and assigned to the assignee of the present application. In said application, an audio signal is digitized (periodically sampled and then quantized into a plurality of parallel bits), and each of the resulting plurality of parallel bits is used to control one of a like plurality of class D RF bridge amplifiers. The RF signals from the bridges are applied to primary windings of respective RF transformers having series-coupled secondary windings. Thus the transformed RF current from all of the bridges flows through all of the secondary windings, thereby requiring a relatively large diameter wire for all secondary windings as well as transformer cores sufficiently large to carry the large diameter wire.

Further, at least one embodiment shown in the aforementioned application requires a binary progression of effective turns ratios for the respective RF transformers, e.g. 1:1, 1:2, 1:4, 1:8, ... 1:128, for eight-bit digitization. The higher of these effective turns ratios may be difficult to achieve due to factors such as winding machine turns counter errors. Further, at high turns ratios, the desired high coupling between primary and secondary windings for maximum RF efficiency may also be difficult to achieve, since it may be difficult to couple e.g. one primary turn to 128 secondary turns.

It is therefore desirable to provide a digital AM transmitter that has RF transformers that have easy-to-implement turns ratios with tight coupling and in which at least some of the transformers may be made with small-diameter secondary wire and small-diameter cores. Further, it is desirable to have at least some identical transformers for purposes of economy.

SUMMARY OF THE INVENTION

Method and apparatus for generating an amplitude modulated signal from a weighted digital signal, comprising generating a plurality of equal amplitude signals in accordance with said digital signal, and cascade combining at least some of said signals using transformers to form said amplitude modulated signal, at least some transformers having a turns ratio in accordance with said weighting of said digital signal.

DETAILED DESCRIPTION

Figure 1:
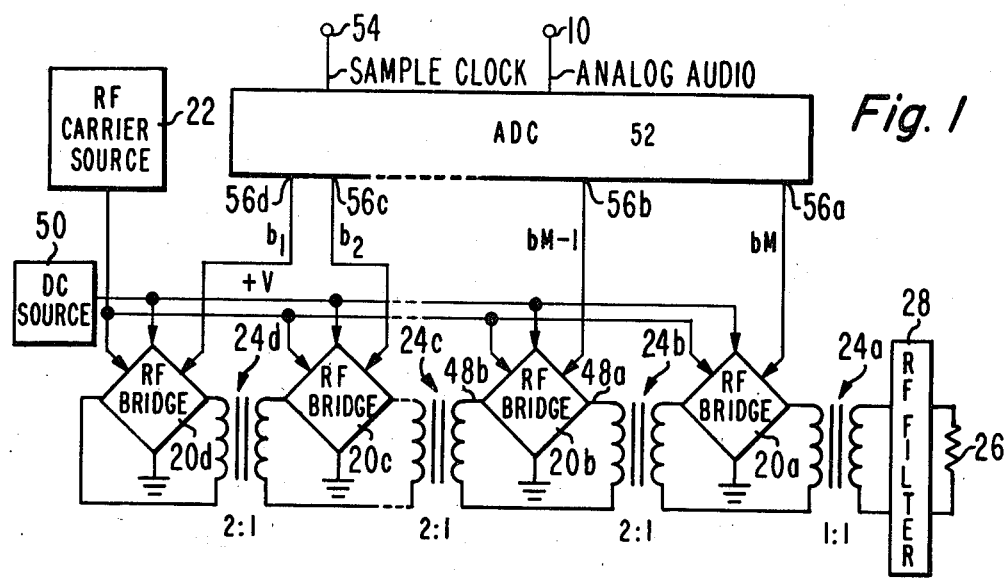
FIG. 1 is a block diagram of a first embodiment of the invention.

FIG. 1 shows a block diagram of an embodiment of the invention. A bandwidth-limited audio modulation signal is received at terminal 10 and applied to M-bit ADC (analog-to-digital converter) 52. A sampling signal from a sample clock (not shown) is received at input terminal 54 and also applied to ADC 52. It is known from the Nyquist criterion that the sampling frequency must be at least twice the highest frequency of the sampled signal. Further, good engineering practice calls for an extra twenty percent increase in the sampling frequency to ease filter design specifications. Thus, if the audio signal at terminal 10 is bandwidth limited to 5 kHz, a suitable sampling frequency might be at least 12 kHz.

The output of ADC 52 comprises a plurality (M) of parallel output lines 56a, 56b, 56c and 56d, which lines 56 convey binary (on-off) signals representing a plurality (M) of binary weighted digits $b_M$, $b_{M-1}$, $b_2$ and $b_1$, respectively, which in turn are collectively representative of the audio modulating signal at input terminal 10. The lines 56 are "parallel" in that a digital bit may appear on each one during each sample interval. Although only four output lines 56a, 56b, 56c and 56d are shown for the sake of clarity, it is to be understood that in actual practive many more, such as eight (256 quantizing levels) are needed to achieve an accurate representation of the audio signal. This is represented by the dotted line portion of the rectangle representing ADC 52. The actual number of bits used is determined by audio fidelity requirements and by the amount of audio frequency harmonic suppression required to keep the sidebands of the RF carrier within allowed limits.

The output lines 56 are applied to M number of RF bridges 20a, 20b, 20c and 20d, respectively. The binary signals on lines 56 serve as bridge control signals for the bridges 20, respectively. The source 50 provides a DC voltage V. Bridges 20 receive RF drive from RF carrier source 22.

The respective amplifier RF output signals from bridges 20a, 20b, 20c and 20d are respectively coupled to the primary windings of M number of RF transformers 24a, 24b, 24c and 24d, said transformers 24 having a 2:1 primary to secondary turns ratio except for isolation transformer 24a, which has a 1:1 turns ratio, or some other ratio to provide a convenient value of filter input impedance. The transformers 24 are cascade coupled together through bridges 20. Because of the cascaded 2:1 turns ratio which steps down the voltage introduced into the primary of transformer 24d by $2^{M-1}$, and steps down the voltage introduced into the primary of transformer 24c by $2^{M-2}$, etc. the bridges 20 if turned on individually, will provide M RF output voltage signals binary weighted in amplitude, respectively. The in-phase RF output voltages attributable to each of the bridges 20 are added together in transformer 24a to form a sum RF signal having an envelope that is a digital approximation of the audio signal at terminal 10. If a "0" signal is present on a line 56, then the corresponding bridge 20 must be short-circuited between transformer terminals to provide a low-impedance path through it to allow voltage from each of the bridges 20 to the left of said respective bridge that have a "1" on the respective lines 56 to be coupled towards the output transformer 24a.

The sum RF signal is applied to filter 28 that removes harmonics of the RF carrier. From filter 28 the sum RF signal is applied to an antenna illustrated as a load resistor 26.

It will be noted that in said prior application the entire RF load current flows through all secondary windings, while in the present invention the entire load current flows only through the windings of transformer 24a and an equivalent current flows through the secondary of transformer 24b, thereby requiring large diameter wire for only these windings. Further, large diameter cores to handle large conductors are only required for transformers 24a and 24b instead of for all cores as in the prior art. Still further, accurate 2:1 turns ratios with tight coupling are easily achieved using trifilar windings with two windings being series coupled together to make up the primary winding, the remaining winding comprising the secondary winding.

Figure 2:
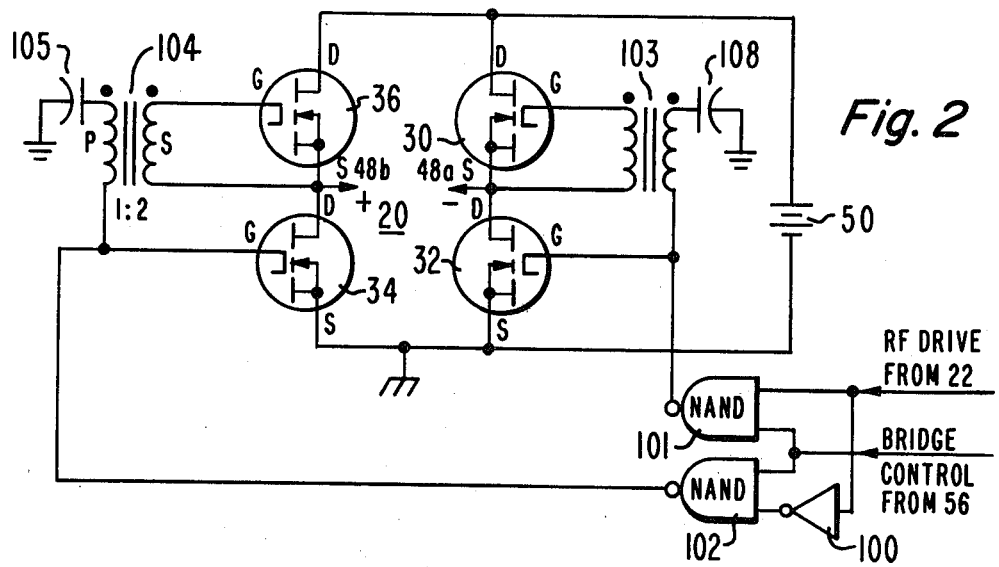
FIG. 2 is a circuit diagram of an RF bridge used in FIG. 1.
Figure 3:
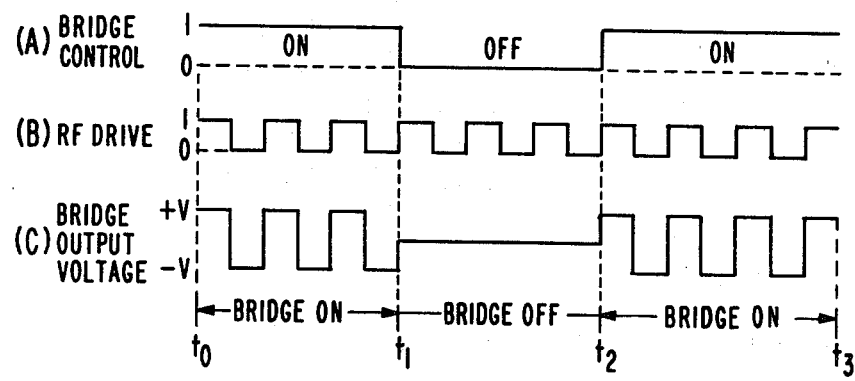
FIG. 3 is a timing diagram useful in explaining FIG. 2.
Figure 4:
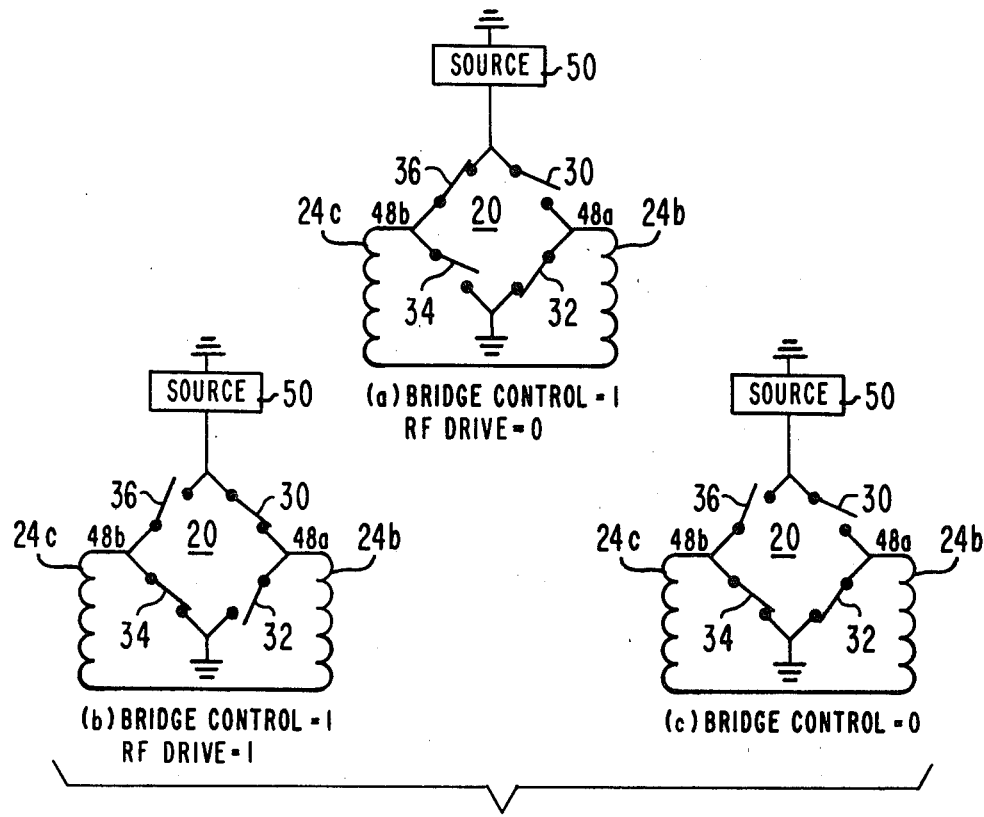
FIG. 4 shows equivalent states of FIG. 2.

FIG. 2 shows in more detail one of the bridges 20 of FIG. 2, while FIG. 3 shows some waveforms present in the arrangement of FIG. 2 during operation, and FIG. 4 shows equivalent circuits during various states of FIG. 2.

In each arm of the bridge 20 are switches comprising N-channel FETs (field effect transistors) 30, 32, 34 and 36, respectively whose main current-carrying source-drain path is switched. Each of transistors 30–36 may represent one of a plurality of parallel-connected transistors, Each of switches 30, 32, 34 and 36 is controlled by two input signals: bridge control (FIG. 3(A)) and RF drive (FIG. 3(B)). The bridge control signal is applied to respective inputs of NAND gates 101 and 102; the RF drive signal is applied to the remaining input of gate 101 and through an inverter 100 to the remaining input of gate 102.

When the bridge control signal has logic level "1" in the interval between times $t_0$ and $t_1$, as shown in FIG. 3(A), and if the RF drive signal is a "1", the output of gate 101 is a "0", which is applied to the gate of transistor 32 to place it in the OFF state. The "0" signal from gate 101 is also applied to the primary of transformer 103. Capacitor 108 prevents magnetization of the core of transformer 103 by the DC component of the signal from gate 101. Transformer 103 inverts the polarity of the signal from gate 101 and typically has a primary to secondary turns ratio of 1:2 to step up the signal voltage, so as to place transistor 30 in the ON state. The output of NAND gate 102 is a "1", which turns ON transistor 34. The "1" signal from gate 102 is applied to the primary of transformer 104. Capacitor 105 prevents magnetization of the core of transformer 104 by the DC component of the signal from gate 102. Capacitors 105 and 108 may be omitted if the windings and core characteristics preclude such saturation. Transformer 104 inverts the polarity of the signal from gate 102 and typically has a primary to secondary turns ratio of 1:2 to step up the signal voltage so as to place transistor 36 in the OFF state. This state is shown in FIG. 4(b) wherein current flows from the ungrounded terminal of source 50 through transistor switch 30, terminal 48a (which is coupled to the primary of the transformer coupled to the next higher significant bit stage as shown in FIG. 1), said primary windings, the secondary of the transformer coupled to the next lower significant bit stage, terminal 48b, transistor switch 34, and finally to the grounded terminal of source 50. This causes a voltage of peak amplitude +V divided by the product of the cascaded turns ratios to the right of the stage in question, as shown in FIG. 1, to be applied to load 26 as shown in FIG. 3(C) in intervals $t_0$–$t_1$ and $t_2$–$t_3$. If more than one bridge is ON, as determined by the respective bridge control line 56, then the voltage present on load 26 will be the sum of the voltage produced by the ON bridges divided by the appropriate turns ratio for each bridge.

When the RF drive goes to level "0" during an interval $t_0$–$t_1$ in which the bridge control signal is high, then the output of NAND gate 101 is "1", thus turning ON transistor 32. The "1" signal from gate 101 is applied to transformer 103, and due to the phase inversion thereof, turns transistor 30 OFF. The output of NAND gate 102 is "0", thus turning OFF transistor 34 and turning ON transistor 36 due to the phase inversion of transformer 104. This state is shown in equivalent form 4 in FIG. 4(a), wherein current flows from the ungrounded terminal of source 50 through transistor switch 36, terminal 48b the secondary winding of the transformer coupled to the next lower significant bit stage, the primary winding of the transformer coupled to the next higher significant bridge stage, terminal 48a, transistor switch 32, and finally to the grounded terminal of source 50. This causes voltage of peak amplitude −V divided by the product of the cascaded turns ratios to the right as shown in FIG. 1 of the stage in question to be applied to load resistor 26 as shown in FIG. 3 (C). Again, if other bridges are ON, the total voltage across load 26 is the sum of each voltage divided by the appropriate turns ratio, which sum this time is negative.

During interval $t_1$–$t_2$ of FIG. 3, the bridge control signal is "0". Since if either input to a NAND gate is "0", its output is "1", the outputs of gates 101 and 102 are "1" regardless of the state of the RF drive. Thus transistors 34 and 32 are ON and transistors 30 and 36 are OFF. This is represented in FIG. 4(c). It will be noted that source 50 is disconnected from the transformers 24 and the output terminals of the bridge are short-circuited to provide a low impedance path from the secondary of the transformer coupled to the next lower bit stage to the primary of the transformer coupled to the next higher bit stage. The other bridges are therefore actually cascade coupled with each other through the one depicted in FIG. 4, and therefore, if they are providing a voltage, these voltages can be applied to load 26 through the short-circuited bridges and the transformers 24.

When the bridge control signal turns a bridge OFF during interval $t_1$ to $t_2$ to FIG. 3(A), switches 32 and 34 are closed and apply a short circuit across the particular bridge in question as shown in FIG. 4(c) and no voltage is generated across load 26 by the particular bridge shown. After time $t_2$, the bridge is again ON and the states depicted in FIGS. 4(a) and 4(b) again alternately occur.

A possible problem with the embodiment of FIG. 1 may arise due to non-linearities in the B-H characteristic of the cores of transformers 24. Non-linearity may particularly manifest itself in transformers associated with the higher significant bit stages, since spurious signals generated therein are less attenuated by the cascade arrangement as compared with spurious signals generated by lower significant bit stages.

Figure 5:
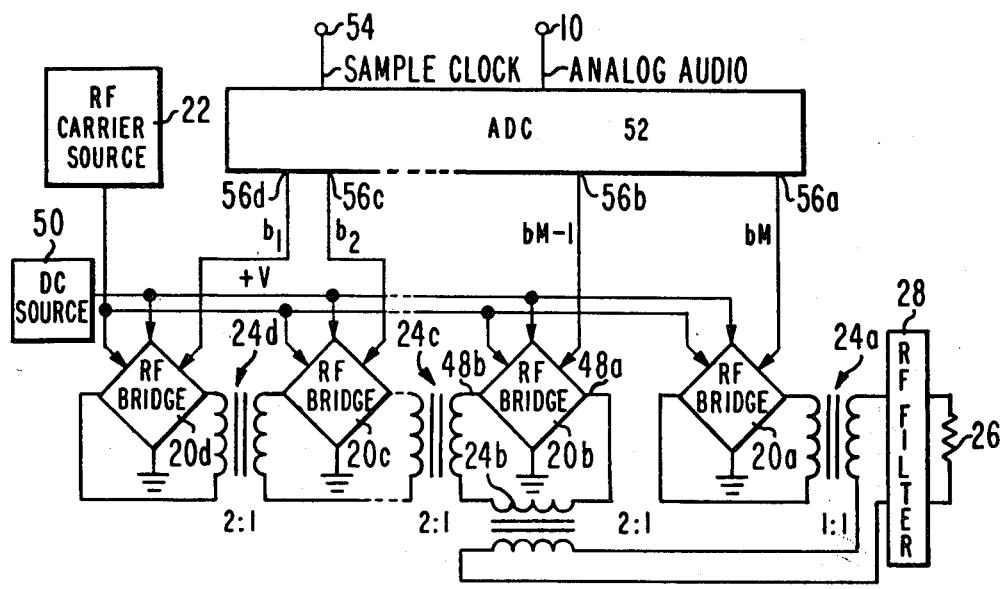
FIG. 5 shows another embodiment of the invention.

FIG. 5 shows an embodiment of the invention for overcoming these problems. It is substantially the same as the embodiment of FIG. 1 except that the two highest significant bit stages 20a and 20b are not coupled in cascade as in FIG. 1, but instead have the secondary windings of their transformers 24a and 24b series coupled together and with filter 28. The number of stages having series coupled outputs depends upon the number of stages that significantly contribute to the non-linearity. The turns ratio of the transformers for the series-coupled higher significant bit stages forms a binary progression, e.g. 1:1, 2:1, 4:1, etc. The remaining lower significant bit stages are cascade coupled, and their transformers have 2:1 turns ratios as in FIG. 1.

Thus in the embodiment of FIG. 5, the higher significant bit stages only handle ON-OFF keyed voltage signals as compared with multilevel signals in the higher significant bit stages in the embodiment of FIG. 1, so linearity problems are reduced, while still avoiding turns ratios such as 128:1, 1:64, etc. that are difficult to achieve with high accuracy. For still better linearity control, the voltage applied to the stages can be controlled using an offset voltage source.

It will be appreciated that many other embodiments are possible within the spirit and scope of the invention. For example, other than binary weighting can be used if the appropriate transformer turns ratio is used. Further, the RF carrier frequency can be used as the sampling frequency to reduce spurious output signals as described in U.S. patent application Ser. No. 265,109 filed May 19, 1981 in the names of F. J. Marlowe and E. S. Kohn and assigned to the same assignee as the present application.

What is claimed is:

1. An apparatus for generating an amplitude modulated signal from a weighted digital signal, said apparatus comprising generating means for generating a plurality of equal amplitude signals in accordance with said digital signal, and combining means for combining at least some of said plurality of signals to form said amplitude modulated signal, said combining means comprising a plurality of cascade coupled transformers having the primary of one transformer coupled to the secondary of another transformer, at least some of said transformers having a turns ratio in accordance with said weighting of said digital signal.

2. An apparatus as claimed in claim 1, wherein said weighting is binary and at least some of said transformers have 2:1 turns ratios.

3. An apparatus as claimed in claim 1 wherein said combining means comprises means for cascade combining all of said plurality of signals.

4. An apparatus as claimed in claim 1 wherein said combining means comprises means for cascade combining only some of said plurality of signals and for series coupling together the remaining signals of said plurality of signals.

5. An apparatus as claimed in claim 1 wherein said generating means comprises a plurality of bridge amplifier stages, and a voltage source coupled to said stages.

6. An apparatus as claimed in claim 1 further comprising an analog-to-digital converter having an input for receiving an analog modulation signal and a plurality of output means for providing said digital signal.

* * * * *